United States Patent
Ebihara et al.

(10) Patent No.: US 7,789,284 B2
(45) Date of Patent: Sep. 7, 2010

(54) ELECTRONIC COMPONENT MOUNTING APPARATUS AND ELECTRONIC COMPONENT MOUNTING METHOD

(75) Inventors: Hiroshi Ebihara, Osaka (JP); Hiroshi Nasu, Osaka (JP); Katsuhiko Watanabe, Osaka (JP); Hiroyuki Kobayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/432,930

(22) Filed: Apr. 30, 2009

(65) Prior Publication Data

US 2009/0277951 A1 Nov. 12, 2009

(30) Foreign Application Priority Data

May 7, 2008 (JP) ............................ 2008-121101
Apr. 15, 2009 (JP) ............................ 2009-099049

(51) Int. Cl.
*B23K 1/06* (2006.01)
*B23K 37/00* (2006.01)

(52) U.S. Cl. .................... 228/1.1; 228/49.5; 228/110.1

(58) Field of Classification Search .................... None
See application file for complete search history.

(56) References Cited

U.S. PATENT DOCUMENTS

| | | | | |
|---|---|---|---|---|
| 3,257,721 A | * | 6/1966 | Jones .......................... | 228/1.1 |
| 3,612,385 A | * | 10/1971 | Humpage .................... | 228/1.1 |
| 3,813,006 A | * | 5/1974 | Holze et al. ................. | 228/1.1 |
| 3,901,749 A | * | 8/1975 | Howells ...................... | 156/73.3 |
| 4,208,001 A | * | 6/1980 | Martner ....................... | 228/1.1 |
| 4,499,845 A | * | 2/1985 | Pope ...................... | 116/137 A |
| 4,667,870 A | * | 5/1987 | Avedissian et al. .......... | 228/103 |
| 5,096,532 A | * | 3/1992 | Neuwirth et al. .......... | 156/580.1 |
| 5,147,082 A | * | 9/1992 | Krause et al. ................ | 228/1.1 |
| 5,730,832 A | * | 3/1998 | Sato et al. ................... | 156/499 |
| 5,772,100 A | * | 6/1998 | Patrikios ..................... | 228/1.1 |
| 5,820,011 A | * | 10/1998 | Ito et al. ...................... | 228/1.1 |
| 5,829,663 A | * | 11/1998 | Khelemsky et al. .......... | 228/1.1 |
| 6,491,785 B1 | * | 12/2002 | Sato et al. ................. | 156/379.6 |
| 7,156,281 B2 | * | 1/2007 | Hizukuri et al. .......... | 228/110.1 |
| 2003/0006265 A1 | * | 1/2003 | Sato ........................... | 228/1.1 |
| 2003/0038158 A1 | * | 2/2003 | Takahashi et al. ......... | 228/110.1 |
| 2003/0136523 A1 | * | 7/2003 | Takahashi et al. ......... | 156/580.1 |
| 2003/0160084 A1 | * | 8/2003 | Higashiyama .............. | 228/1.1 |

(Continued)

FOREIGN PATENT DOCUMENTS

EP 154709 A1 * 9/1985

(Continued)

*Primary Examiner*—Kiley Stoner
(74) *Attorney, Agent, or Firm*—RatnerPrestia

(57) ABSTRACT

There is provided an electronic component mounting apparatus including: a component holder which holds an electronic component; a pressing unit which applies pressure to the held electronic component through the component holder; and an ultrasonic transducer which applies ultrasonic vibration to the held electronic component through the component holder. The component holder includes a horn at one end of which is mounted the ultrasonic transducer and a holding tool which is fixed to the other end of the horn by using bolts and holds the electronic component. The horn has a surface $A_1$ and a surface $A_2$ at the other end and the holding tool has a surface $B_1$ in intimate contact with the surface $A_1$ and a surface $B_2$ in intimate contact with the surface $A_2$.

9 Claims, 16 Drawing Sheets

U.S. PATENT DOCUMENTS

2009/0031558 A1 * 2/2009 Mizuno et al. ............... 29/740
2009/0265924 A1 * 10/2009 Ebihara et al. ............... 29/739

FOREIGN PATENT DOCUMENTS

| JP | 2001-035888 A | 2/2001 |
| JP | 2004-134563 A | 4/2004 |
| JP | WO 2007/129700 A1 * | 11/2007 |

* cited by examiner

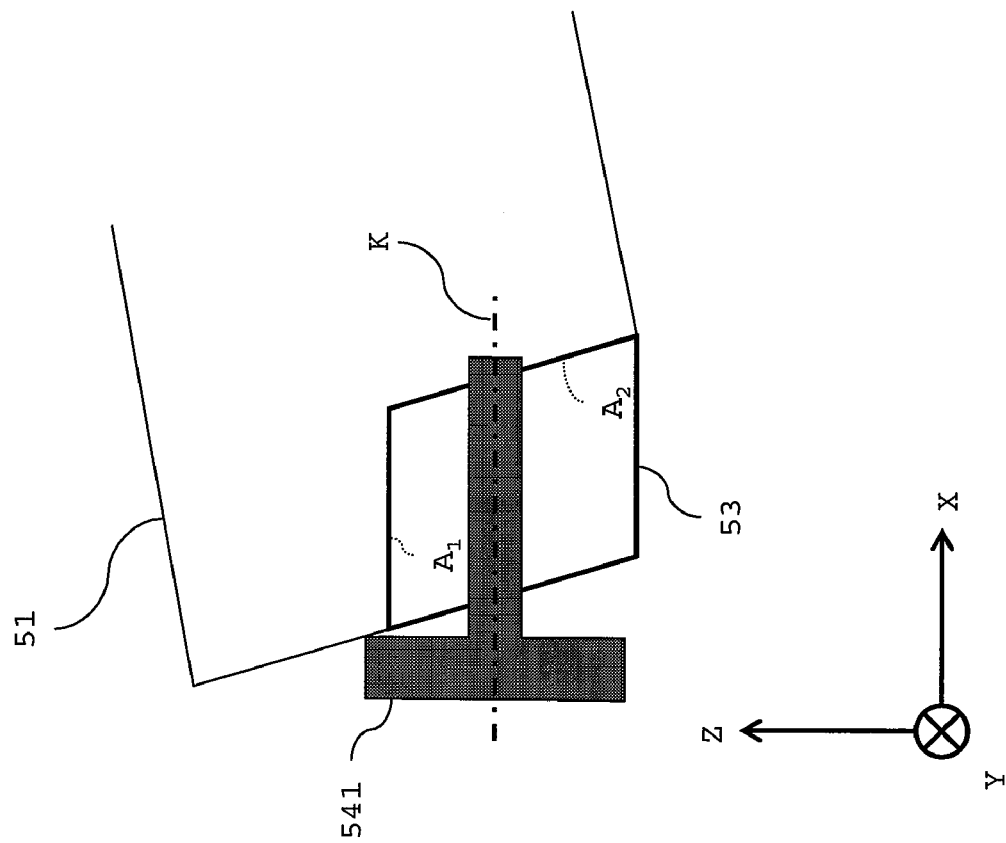
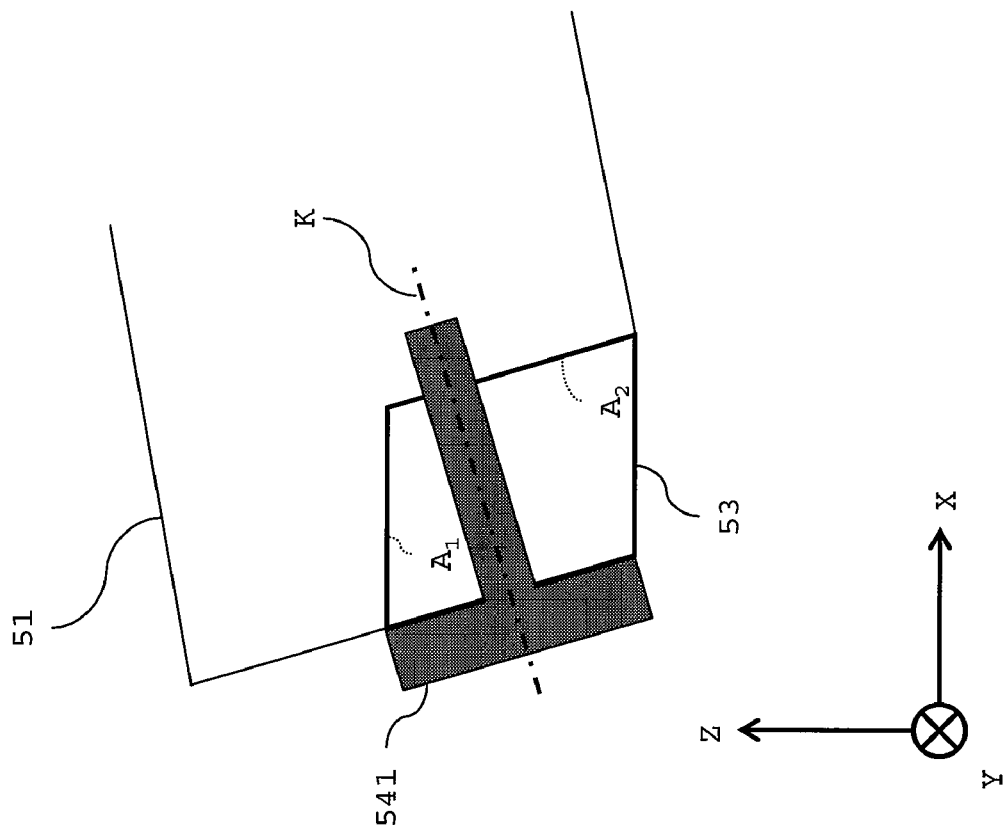

FIG. 16 (A) PRIOR ART
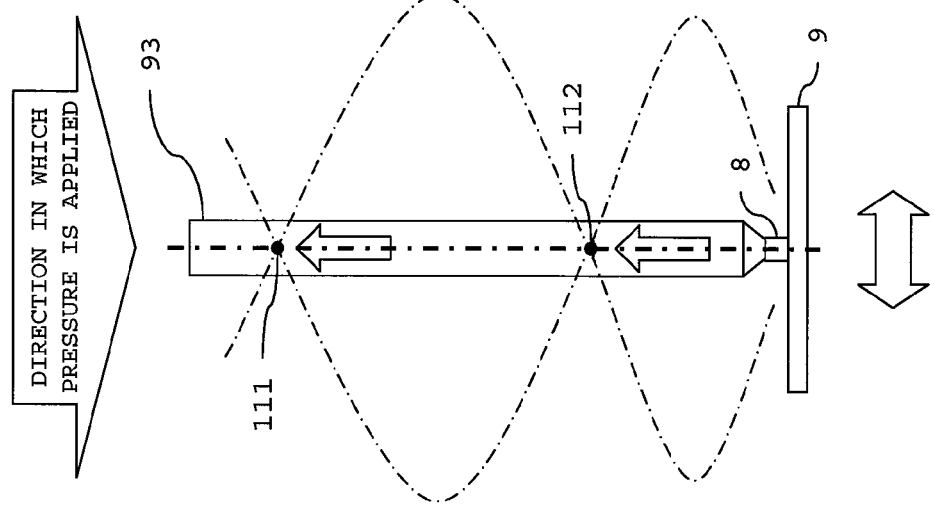
FIG. 16 (B) PRIOR ART
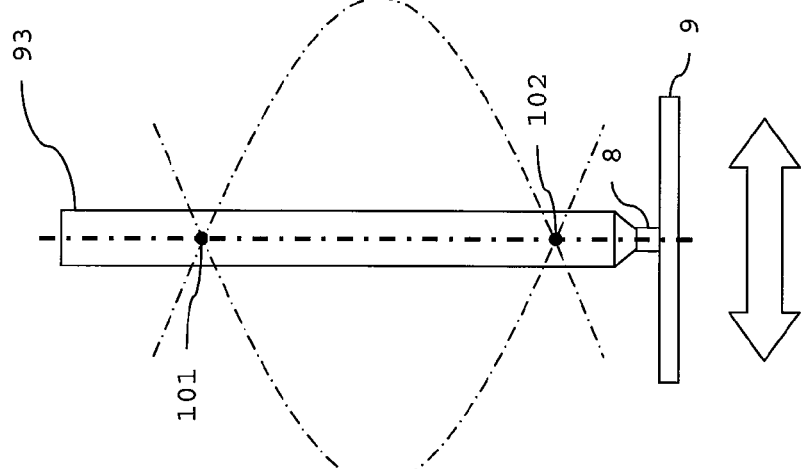

ELECTRONIC COMPONENT MOUNTING APPARATUS AND ELECTRONIC COMPONENT MOUNTING METHOD

BACKGROUND OF THE INVENTION

1. Field of the Invention

The present invention relates to an electronic component mounting apparatus and an electronic component mounting method that mount electronic components onto a circuit board or the like.

2. Related Art of the Invention

Various bonding methods for bonding a bump electrode of an electronic component to an electrode on a printed circuit board are known. For example, ultrasonic bonding is one bonding method capable of bonding an electronic component to a circuit board in a short time.

The ultrasonic bonding is a method which vibrates an electronic component by ultrasonic vibration while pressing the electronic component against a circuit board to cause local slippage at the bonding interface between the circuit board and the electronic component to break up and blow away a coating, thereby electrically bonding an electrode of the electronic component to an electrode on the circuit board at the atomic level.

Primarily referencing FIG. 14, a configuration and operation of a conventional electronic component mounting apparatus that uses ultrasonic bonding mentioned above will be described.

FIG. 14 is a schematic side view of a conventional electronic component mounting apparatus.

The conventional electronic component mounting apparatus performs bump bonding of an electronic component 8 to a circuit board 9 (see Japanese Patent Laid-Open No. 2004-134563, for example).

The entire disclosure of Japanese Patent Laid-Open No. 2004-134563 is incorporated herein by reference in its entirety.

The conventional electronic component mounting apparatus includes a mounting head 100 having a horn 91 having an ultrasonic transducer 92 fixed at one end and clamping a sticklike holding tool 93 at the other end. The horn 91 extends in a horn axis line I.

Ultrasonic vibration applied by the ultrasonic transducer 92 travels in the traveling direction along the horn axis line I to the holding tool 93 as a longitudinal wave whose vibration in the medium is parallel to the traveling direction.

The electronic component mounting apparatus vibrates the electronic component 8 through the holding tool 93 by the ultrasonic transducer 92 while pressing the electronic component 8 against the circuit board 9 through the holding tool 93 by a pressing unit (not shown), thereby electrically bonding an electrode of the electronic component 8 to an electrode on the circuit board 9.

Referring to FIG. 15, the mounting head 100 of the conventional electronic component mounting apparatus will be described in further detail.

FIG. 15 is a schematic perspective view of the mounting head 100 of the conventional electronic component mounting apparatus.

At the tip of the horn 91, the holding tool 93 is clamped by two split portions 911 and 912 in the direction perpendicular to the direction of ultrasonic vibration applied by the ultrasonic transducer 92.

More specifically, a so-called split clamp structure is provided at the tip of the horn 91. The horn 91 uses a fixation screw 94 that fastens the two split portions 911 and 912 formed by the split with equal torque to clamp the holding tool 93 inserted in a through-hole 913.

The two split portions 911 and 912 are disposed symmetrically with respect to the horn axis line I of the horn 91 in order to evenly transmit ultrasonic vibration applied by the ultrasonic transducer 92 to the holding tool 93.

SUMMARY OF THE INVENTION

However, with the conventional electronic component mounting apparatus described above, it is sometimes difficult to achieve stable ultrasonic bonding.

More specifically, the holding surface of the holding tool 93 which holds the electronic component 8 by suction can become worn or foreign substances can attach to the holding surface because of friction of the holding surface against the electronic component 8. Consequently, the electronic component 8 held by suction can tilt with respect to the circuit board 9.

In such cases, the holding surface is polished. However, when the length of the holding tool 93 has been reduced by polishing to a certain value or less, the holding tool 93 needs to be replaced.

The holding tool 93 may also be replaced when an electronic component 8 of a different type is to be mounted to the circuit board 9.

However, the holding tool 93 is in line-contact with lines $L_1$ and $L_2$ or, in the worst case, in point-contact with points $P_1$ and $P_2$ while being clamped by the two spilt portions 911 and 912.

Therefore, every time the holding tool 93 is replaced, the condition of contact between the holding tool 93 and the horn 91 tends to slightly change and therefore is not precisely reproducible.

As a result, the amplitude of vibration and trajectory of the tip of the holding tool 93 during application of ultrasonic vibration change each time the holding tool 93 is replaced. Thus, it is difficult to achieve stable ultrasonic bonding.

In light of the problem with the related art described above, an object of the present invention is to provide an ultrasonic electronic component mounting apparatus and an ultrasonic electronic component mounting method capable of achieving more stable ultrasonic bonding.

The $1^{st}$ aspect of the present invention is an electronic component mounting apparatus comprising:

a component holder which holds an electronic component;

a pressing unit which applies pressure to the held electronic component through the component holder; and an ultrasonic transducer which applies ultrasonic vibration to the held electronic component through the component holder, wherein the component holder includes a horn to one end of which the ultrasonic transducer is fixed, and a holding tool which is fixed to the other end of the horn by a fastening unit and holds the electronic component, the horn has a first horn surface and a second horn surface at the other end, and the holding tool has a first tool surface in intimate contact with the first horn surface and a second tool surface in intimate contact with the second horn surface.

The $2^{nd}$ aspect of the present invention is the electronic component mounting apparatus according to the $1^{st}$ aspect of the present invention, wherein the first horn surface and the first tool surface are surfaces transmitting at least the applied pressure, and the second horn surface and the second tool surface are surfaces transmitting at least the applied ultrasonic vibration.

The 3rd aspect of the present invention is the electronic component mounting apparatus according to the 1st aspect of the present invention, wherein the fastening unit includes a plurality of fastening elements, and the plurality of fastening elements are disposed symmetrically with respect to a horn axis line passing through a center of a cross section of the horn and extending in a direction in which the applied ultrasonic vibration is transmitted.

The 4th aspect of the present invention is the electronic component mounting apparatus according to the 2nd aspect of the present invention, wherein a horn axis line passing through a center of a cross section of the horn and extending in a direction in which the applied ultrasonic vibration is transmitted is non-parallel to the first horn surface.

The 5th aspect of the present invention is the electronic component mounting apparatus according to the 4th aspect of the present invention, wherein an angle the horn axis line forms with respect to the first horn surface is less than or equal to 45 degrees.

The 6th aspect of the present invention is the electronic component mounting apparatus according to the 2nd aspect of the present invention, wherein a horn axis line passing through a center of a cross section of the horn and extending in a direction in which the applied ultrasound vibration is transmitted is non-perpendicular to the second horn surface.

The 7th aspect of the present invention is the electronic component mounting apparatus according to the 6th aspect of the present invention, wherein a complementary angle of an angle the horn axis line forms with respect to the second horn surface is less than or equal to 45 degrees.

The 8th aspect of the present invention is the electronic component mounting apparatus according to the 1st aspect of the present invention, wherein the fastening unit is a bolt and an internal thread, the internal thread is provided in the second horn surface, and the bolt passes through a through-hole provided in the holding tool and is screwed into the internal thread, and a screwing applies surface pressure to a connection part between the second horn surface and the second tool surface in a direction in which the applied ultrasonic vibration is transmitted.

The 9th aspect of the present invention is the electronic component mounting apparatus according to the 1st aspect of the present invention, wherein the horn includes a heater which applies heat to the holding tool, and a fastening retaining force of the fastening unit increases when the heat is applied.

The 10th aspect of the present invention is the electronic component mounting apparatus according to the 1st aspect of the present invention, wherein the pressing unit applies pressure to the held electronic component through a supporter fixed to the horn.

The 11th aspect of the present invention is an electronic component mounting method comprising the steps of:

holding an electronic component by using a component holder:

applying pressure to the held electronic component through the component holder by using a pressing unit; and applying ultrasonic vibration to the held electronic component through the component holder by using an ultrasonic transducer, wherein the component holder includes a horn to one end of which the ultrasonic transducer is fixed, and a holding tool which is fixed to the other end of the horn by a fastening unit and holds the electronic component, the horn has a first horn surface and a second horn surface at the other end, and the holding tool has a first tool surface in intimate contact with the first horn surface and a second tool surface in intimate contact with the second horn surface.

With the configuration of the present invention, an electronic component mounting apparatus and an electronic component mounting method capable of achieving more stable ultrasonic bonding can be provided.

BRIEF DESCRIPTION OF THE DRAWINGS

FIG. 8(A) is a schematic cross-sectional view illustrating a structure in which the surface $A_1$ is not orthogonal to the surface $A_2$ according to an exemplary embodiment of the present invention (I); FIG. 8(B) is a schematic cross-sectional view illustrating a structure in which the surface $A_1$ is not orthogonal to the surface $A_2$ according to an exemplary embodiment of the present invention (II);

FIG. 16(A) is a diagram illustrating a vibration mode of a mounting head of the conventional electronic component mounting apparatus at no load; and FIG. 16(B) is a diagram illustrating a vibration mode of the mounting head of the conventional electronic component mounting apparatus at load.

DESCRIPTION OF SYMBOLS

50 Component holder
51 Horn
53 Holding tool
511 Pin
512, 513 Internal thread
533 Groove
534, 535 Through-hole
541, 542 Bolt
$A_1, A_2, B_1, B_2$ Surface
J Horn axis line
K Bolt axis line

PREFERRED EMBODIMENTS OF THE INVENTION

Exemplary embodiments of the present invention will be described below in detail with reference to the accompanying drawings.

Primarily referring to FIGS. 1 and 2, a configuration of an electronic component mounting apparatus according to an exemplary embodiment will be described first.

Figure 1:
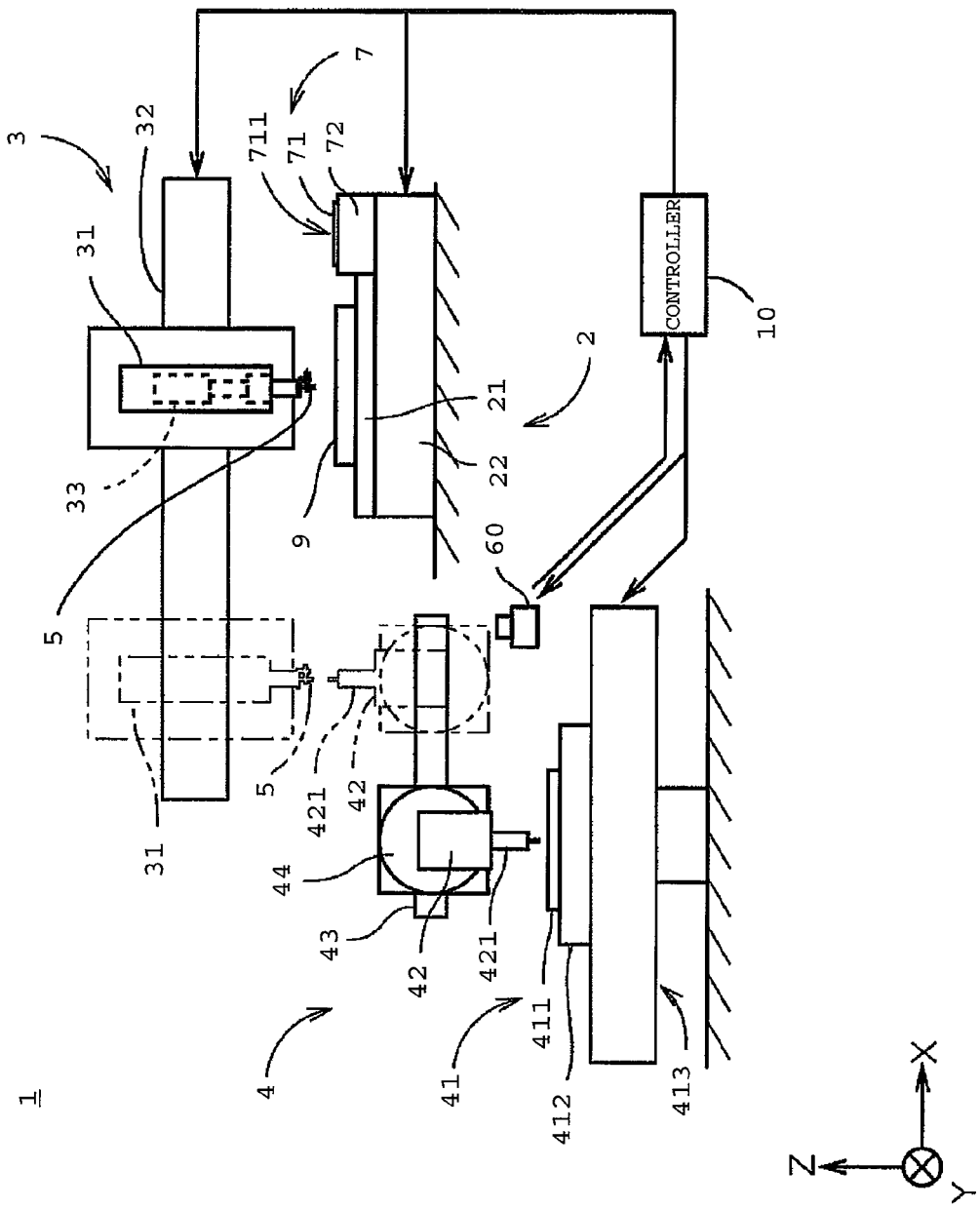
FIG. 1 is a schematic front elevation view of an electronic component mounting apparatus according to an exemplary embodiment of the present invention.

FIG. 1 is a schematic front elevation view of an electronic component mounting apparatus 1 according to an exemplary embodiment of the present invention.

Figure 2:
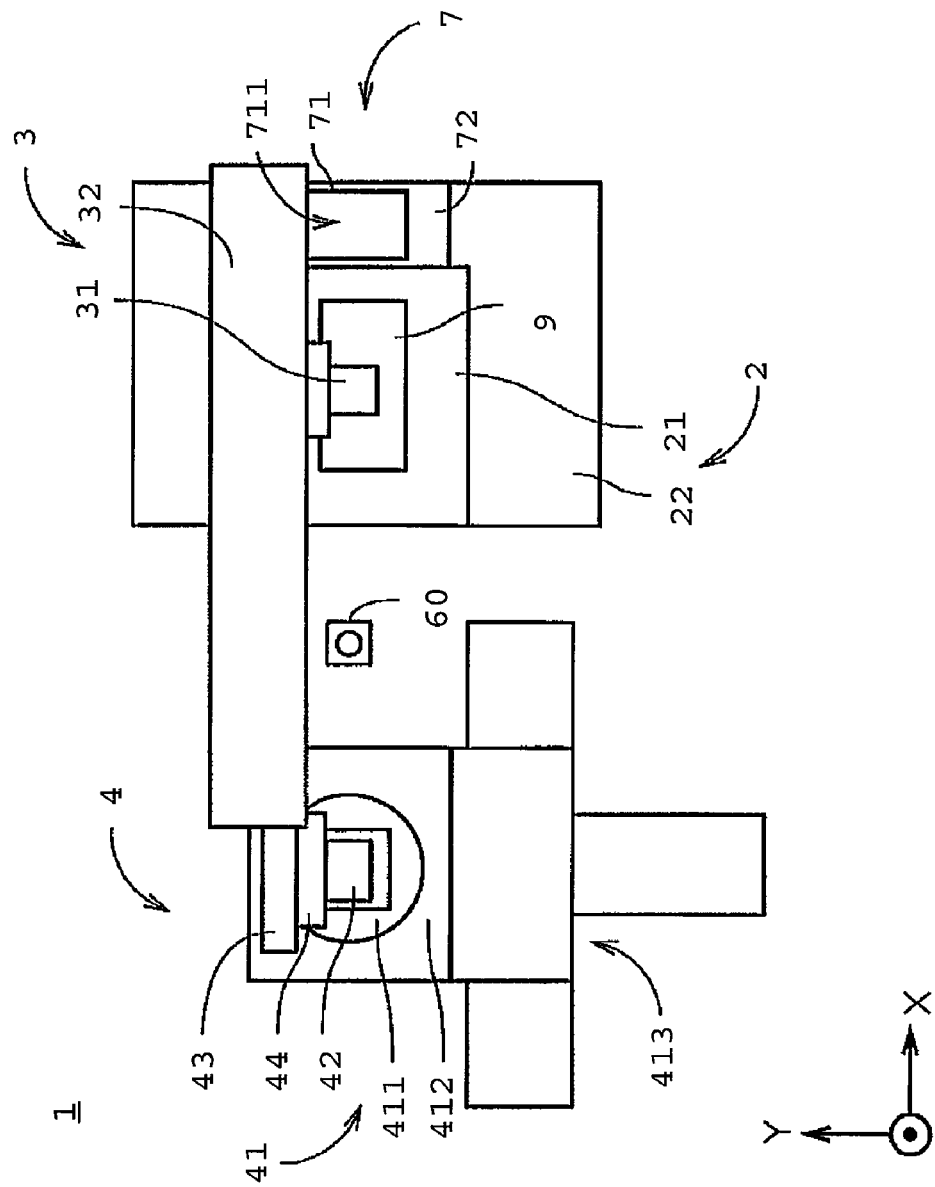
FIG. 2 is a schematic plan view of the electronic component mounting apparatus according to the exemplary embodiment of the present invention.

FIG. 2 is a schematic plan view of the electronic component mounting apparatus 1 according to the exemplary embodiment of the present invention.

The electronic component mounting apparatus 1 is a so-called flip-chip bonder which mounts a tiny electronic component such as an LED (Light Emitting Diode) chip face down on a circuit board 9 such as a printed circuit board and at the same time bonds electrodes together.

The electronic component mounting apparatus 1 includes a circuit-board holder 2, a component mounting unit 3, a component feeder 4, and an image pickup unit 60.

The component mounting unit 3 which mounts an electronic component 8 (see FIG. 3 hereinafter for the electronic component 8) onto a circuit board 9 held by the circuit-board holder 2 is provided on the (+Z) side of the circuit-board holder 2, that is, above the circuit-board holder 2.

The component feeder 4 which feeds an electronic component 8 to the component mounting unit 3 is provided on the (−X) side of the circuit-board holder 2.

The image pickup unit 60 which takes an image of the electronic component 8 fed to the component mounting unit 3 by the component feeder 4 is provided between the circuit-board holder 2 and the component feeder 4.

A polishing unit 7 which polishes a tip 531 (see FIG. 3 hereinafter for the tip 531) for holding the electronic component 8 is provided on the (+X) side of the circuit board 9.

These mechanisms are controlled by a controller 10 to mount the electronic component 8 onto the circuit board 9.

A configuration of each of the circuit-board holder 2, the component mounting unit 3, the component feeder 4, and the image pickup unit 60 will be described in further detail in this order.

The circuit-board holder 2 includes a stage 21 holding the circuit board 9 and a stage driving mechanism 22 which moves the stage 21 in the Y-direction.

The polishing unit 7 is attached on the (+X) side of the stage 21 and is moved by the stage driving mechanism 22 in the Y-direction together with the stage 21.

The polishing unit 7 includes a polishing sheet 71 having a flat level polishing surface 711 and a polishing sheet holder 72 which holds the polishing sheet 71.

The component mounting unit 3 includes a component mounting section 31 having a pressing unit 33, a head supporter 34 (see FIG. 3 hereinafter for the head supporter 34), a shaft 35 (see FIG. 3 hereinafter for the shaft 35), a component holder 50 (see FIG. 3 hereinafter for the component holder 50) and an ultrasonic transducer 52 (see FIG. 3 hereinafter for the ultrasonic transducer 52), and a mounting section driving mechanism 32 which moves the component mounting section 31 in the X-direction.

The pressing unit 33 uses a lifting-and-lowering mechanism having a motor (not shown) to move the shaft 35 in the Z-direction to press a horn 51 (see FIG. 3 hereinafter for the horn 51) attached to the shaft 35 through the head supporter 34.

The component feeder 4 includes a component positioning section 41 which positions an electronic component 8 in a predetermined position, a feed head 42 which takes the electronic component 8 from the component positioning section 41 and holds the electronic component 8, a feed head driving mechanism 43 which moves the feed head 42 in the X-direction, and a turning mechanism 44 which turns and slightly lifts and lowers the feed head 42.

The component positioning section 41 includes a component tray 411 on which many electronic components 8 are placed, a stage 412 holding the component tray 411, and a tray driving mechanism 413 which moves the component tray 411 in the X- and Y-directions together with the stage 412.

Many electronic components 8 to be mounted onto the circuit board 9 are placed on the component tray 411 in the orientation opposite to the orientation in which they are mounted on the circuit board 9, in such a manner that their bottom surfaces that face the circuit board 9 when mounted, that is, the bonding surfaces on which an electrode to be bonded to the circuit board 9 is formed, face upward.

The feed head 42 includes a feed collet 421 which feeds the electronic component 8 held by suction of a suction opening formed in its tip to the mounting head 5.

The electronic components 8 may be any of LED chips, semiconductor light-emitting devices such as semiconductor lasers, packaged ICs (Integrated Circuits), resistances, capacitors, semiconductor devices such as microchips, SAW (Surface Acoustic Wave) filters, and non-semiconductor electronic components such as camera modules.

The circuit board 9 may be any of a circuit board made of resin and a circuit board made of a non-resin material such as glass and semiconductor.

The electrode portion of the electronic component 8 may be a protruding bump made of gold (Au) on an electrode pattern of the electronic component 8 or a plated bump depending on the type of the electronic component 8, or an electrode pattern itself.

A protruding bump may be provided on an electrode on the circuit board 9 instead of a protruding bump formed on an electrode pattern of the electronic component 8.

The image pickup unit 60 is provided right under the transfer path of the component mounting section 31, in particular the mounting head 5, moved by the mounting section driving mechanism 32, and takes an image of the electronic component 8 held by the mounting head 5 from the (−Z) side.

The image pickup unit 60 is disposed in such a position that the image pickup unit 60 does not interfere with the component mounting section 31 being moved.

A configuration of the mounting head 5 including the component holder 50, the ultrasonic transducer 52, the head supporter 34, the shaft 35 and other components will be described next with reference to FIG. 3.

Figure 3:
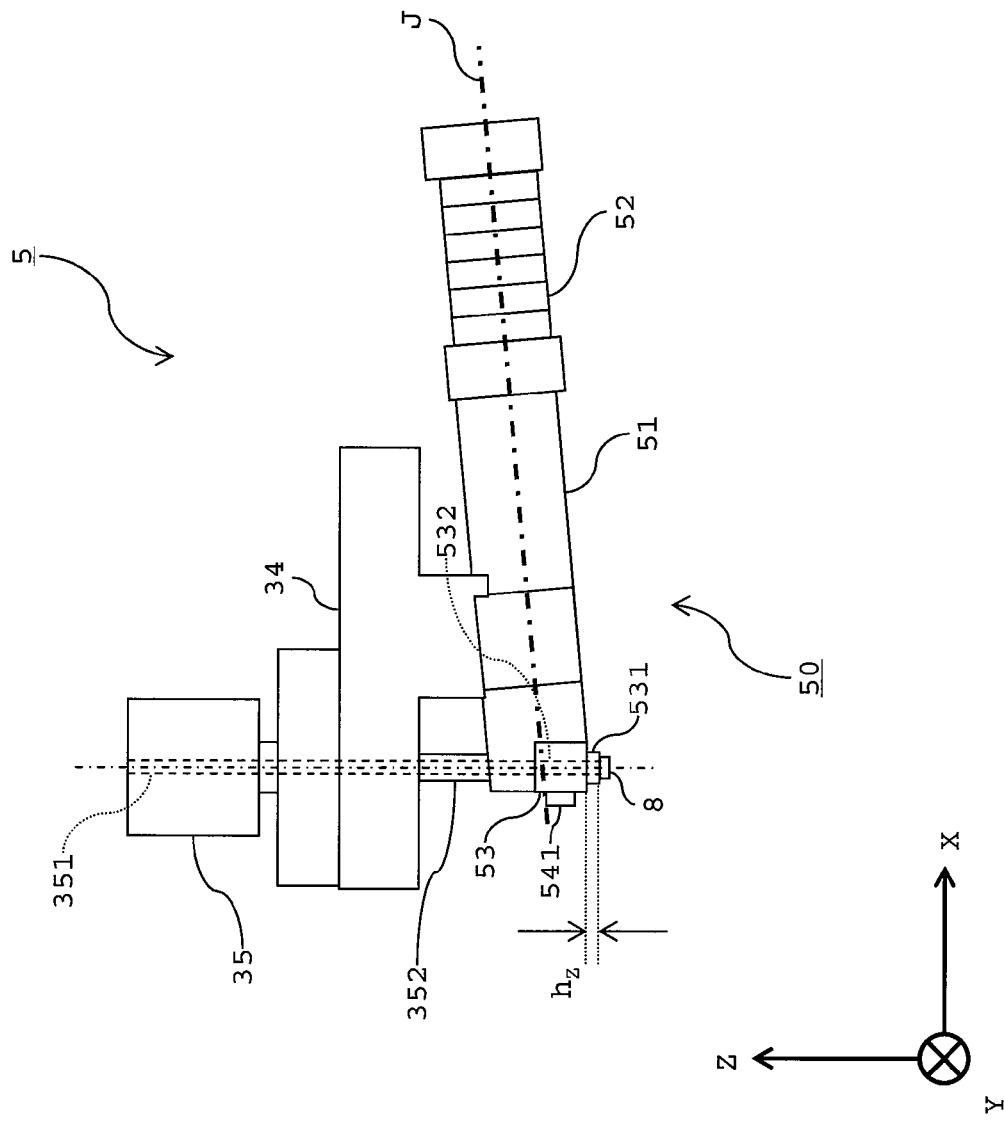
FIG. 3 is a schematic front elevation view of a mounting head according to the exemplary embodiment of the present invention.

FIG. 3 is a schematic front elevation view of the mounting head 5 in the exemplary embodiment of the present invention.

The component holder 50 includes the horn 51 having the ultrasonic transducer 52 fixed at one end and a holding tool 53 fixed at the other end of the horn 51 with bolts 541 and 542 (see FIG. 4 hereinafter for the bolts 541 and 542).

The ultrasonic transducer 52 uses a piezoelectric element (not shown) to apply ultrasonic vibration to be transmitted to the electronic component 8 held by the holding tool 53.

The head supporter 34 supports the horn 51 at a nodal point of ultrasonic vibration which becomes a stationary wave in a resonant state.

The shaft 35 is attached to the horn 51 through the head supporter 34 and is moved by the pressing unit 33 (see FIG. 1) in the Z-direction as stated above.

The component holder 50 is lifted and lowered relative to the circuit board 9 (see FIG. 1) and the polishing surface 711 (see FIG. 1) by the arrangement described above.

The holding tool 53 is made of stainless steel having a good vibration property and vibration transmission property and has the shape of a rectangular parallelepiped.

The holding tool 53 has a columnar tip 531 which has a cross section suited to the size and type of the electronic component 8 and is used for holding an electronic component 8.

The tip 531 has such a height $h_z$ in the Z-direction that the tip 531 does not produce flexural vibration.

The fact that the height $h_z$ is adjusted to prevent flexural vibration is important as described below.

In semiconductor flip-chip mounting such as LED device mounting, wide variety of electronic components 8 are to be mounted and those electronic components 8 have increased in size with the increasing output power. Accordingly, an electronic component 8 having as many as 20 bumps, for example, may be pressed against a circuit board 9 with a high load on the order of 30 N during application of ultrasonic vibration.

However, in the conventional electronic component mounting apparatus described earlier, the amplitude of vibration of the tip of the holding tool 93 changes and bonding failures due to mounting misalignment and damages to elements often occur when the electronic component 8 is pressed against the circuit board 9 with high load.

When ultrasonic vibration is applied, loops where large vibration occurs and nodes where little vibration occurs appear in the sticklike holding tool 93 due to flexural vibration.

The loops and nodes shift due to variations in load.

For example, nodes 101 and 102 at no load shift to nodes 111 and 112 at load as shown in FIGS. 16(A) and 16(B) because of drag from the circuit board 9 caused by the load. Consequently, the tip of the holding tool 93 which sufficiently vibrated without loss at no load may fail to sufficiently vibrate at load.

FIG. 16(A) is a diagram illustrating a vibration mode of the mounting head 100 of the conventional electronic component mounting apparatus at no load and FIG. 16(B) is a diagram illustrating a vibration mode of the mounting head 100 of the conventional electronic component mounting apparatus at load.

Vibration amplitude of the tip of the holding tool 93 in the configuration of the conventional electronic component mounting apparatus is liable to variation as described above. Therefore, it is often difficult to achieve stable ultrasonic bonding with the conventional electronic component mounting apparatuses.

In the exemplary embodiment, the amplitude of vibration of the tip 531 hardly changes and the vibration mode is desirable because the height $h_z$ is not too large and is adjusted to prevent flexural vibration as describe above.

A vacuum suction path 532 used for sucking the electronic component 8 is formed in the center of the holding tool 53.

The suction path 532 is connected to another suction path 351 formed in the head supporter 34 and the shaft 35 on the (+Z)-side end of the holding tool 53 through a tube 352.

The suction path 351 is connected to a pump (not shown) and the electronic component 8 is held at the tip 531 by suction.

The configuration of the component holder 50 according to the exemplary embodiment will be described in further detail with reference to FIGS. 4 and 5.

Figure 4:
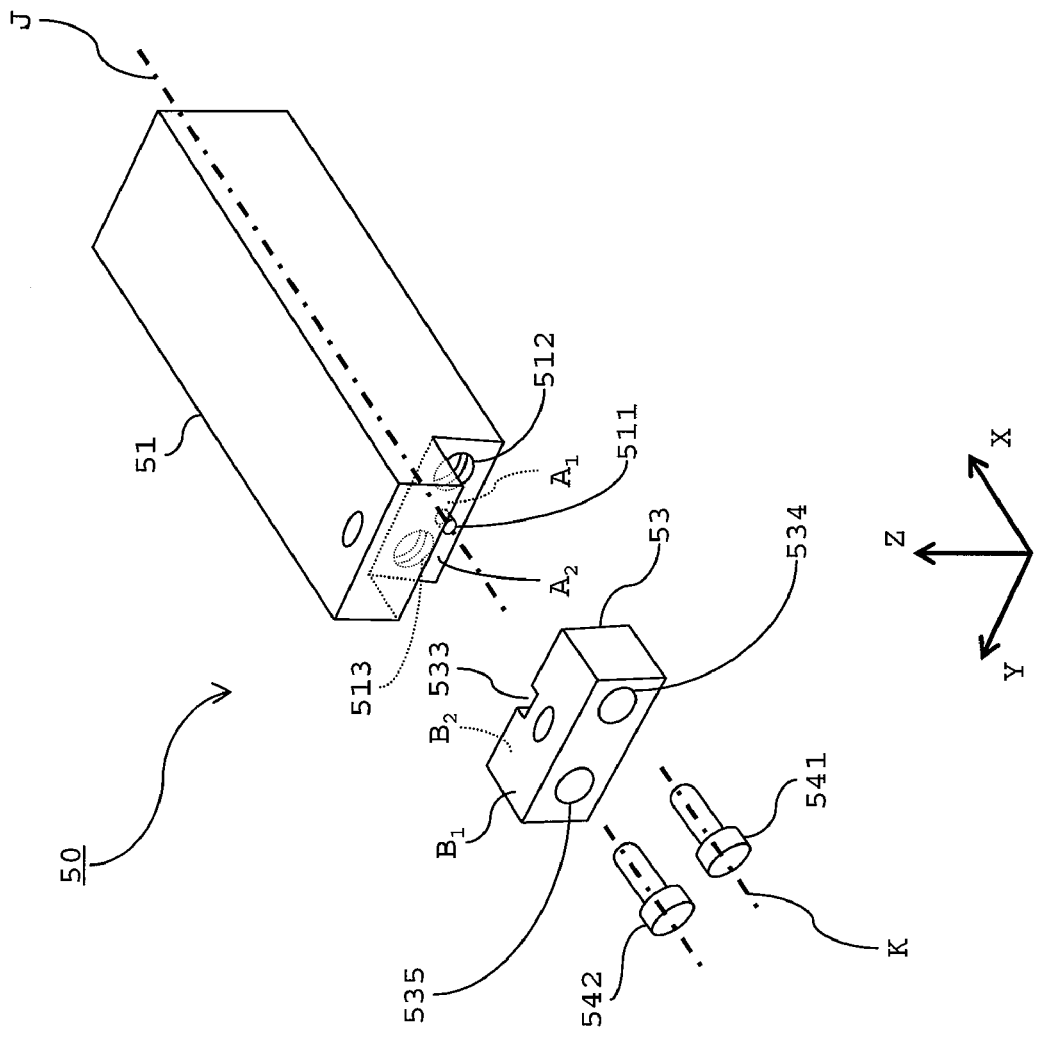
FIG. 4 is a schematic exploded perspective view of a component holder according to the exemplary embodiment of the present invention.

FIG. 4 is a schematic exploded perspective view of the component holder 50 according to the exemplary embodiment of the present invention.

Figure 5:
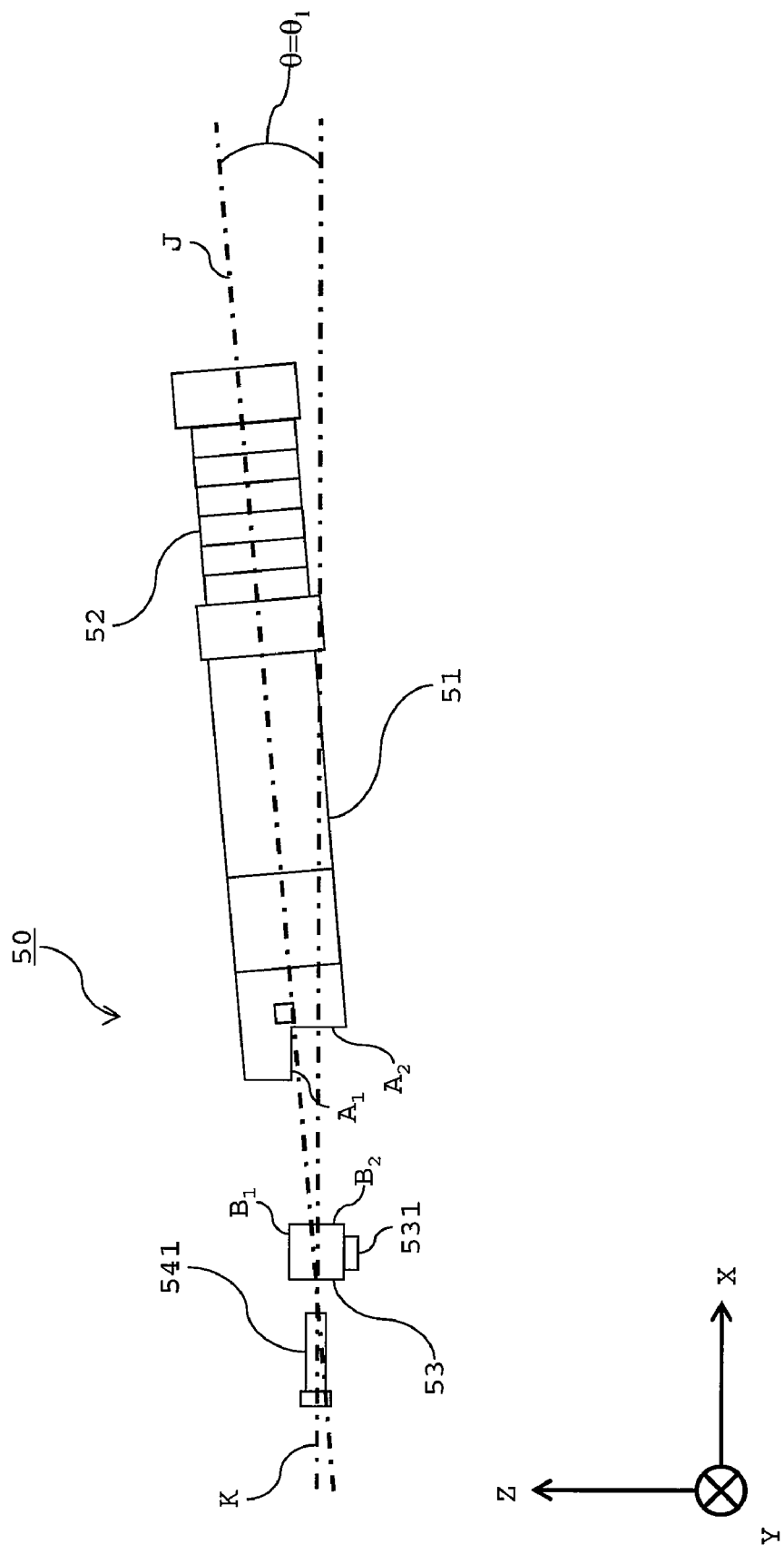
FIG. 5 is a schematic exploded front elevation view of the component holder according to the exemplary embodiment of the present invention.

FIG. 5 is a schematic exploded front elevation view of the component holder 50 according to the exemplary embodiment of the present invention.

The horn 51 extends along the horn axis line J in the X-direction.

The horn 51 has a surface $A_1$ parallel to the XY plane and a surface $A_2$ parallel to the YZ plane at the end opposite the end at which the ultrasonic transducer 52 is fixed.

The holding tool 53 has a surface $B_1$ that can be brought into intimate contact with the surface $A_1$ and is parallel to the XY plane and a surface $B_2$ that can be brought into intimate contact with the surface $A_2$ and is parallel to the YZ plane.

The holding tool 53 is fixed to the horn 51 with bolts 541 and 542.

The surfaces $A_1$ and $B_1$ are the surfaces for transmitting pressure applied by the pressing unit 33.

The surfaces $A_2$ and $B_2$ are the surfaces for transmitting ultrasonic vibration applied by the ultrasonic transducer 52.

When the holding tool 53 is replaced, a new holding tool 53 can be firmly fixed to the horn 51 with good reproducibility because of the configuration in which the surface $B_1$ can be brought into intimate contact with the surface $A_1$ and the surface $B_2$ can be brought into intimate contact with the surface $A_2$.

In addition, attenuation of the amplitude and phase variations of ultrasonic vibration can be reduced without a pressure loss and therefore vibration properties of the electronic component 8 can be improved.

A pin 511 is provided as a protrusion in the horn 51. A groove 533 is provided as a recess in the holding tool 53.

The holding tool 53 can be correctly positioned with respect to the horn 51 in the X- and Y-directions by inserting the pin 511 into the groove 533 all the way seated.

The holding tool 53 can be correctly positioned in the Z-direction by bringing the surface $A_1$ of the horn 51 into intimate contact with the surface $B_1$ of the holding tool 53.

In this way, the holding tool 53 is correctly positioned with respect to the horn 51 in all of the X-, Y-, and Z-directions.

Figure 6B:
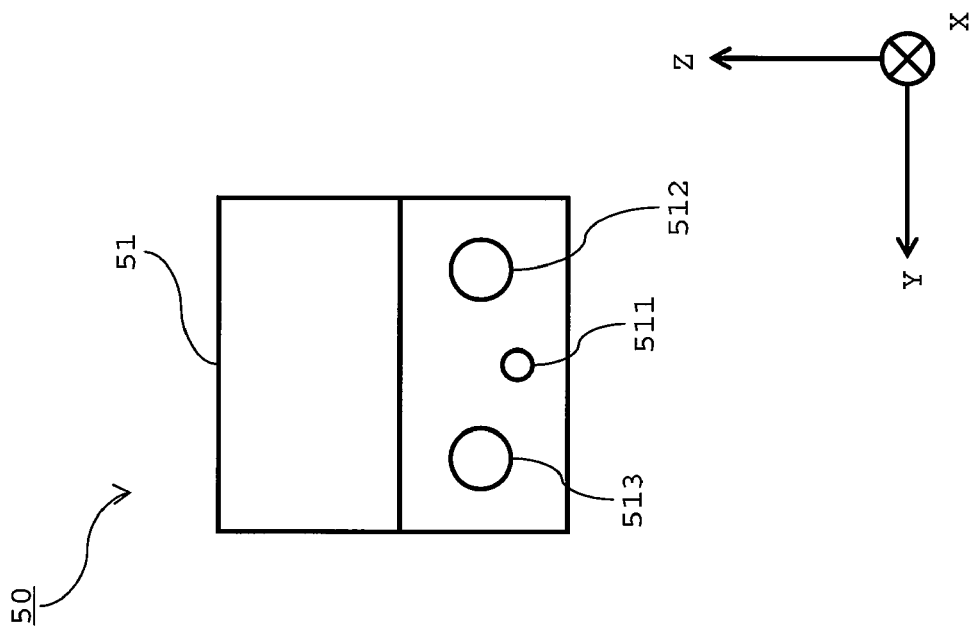
FIG. 6(B) is a schematic side view of the component holder according to the exemplary embodiment of the present invention after the holding tool is fixed to the horn by using the bolts.
Figure 6A:
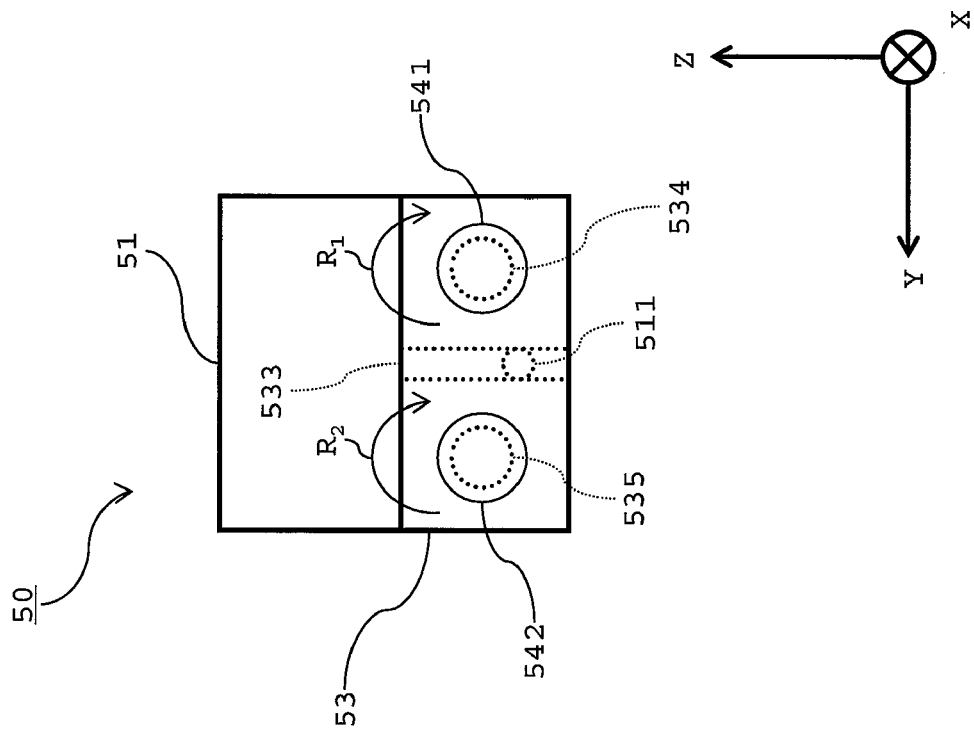
FIG. 6(A) is a schematic side view of the component holder according to the exemplary embodiment of the present invention before a holding tool is fixed to a horn by using bolts.

The holding tool 53 is fixed as shown in FIGS. 6(A) and 6(B) without a gap between the surfaces $A_1$ and $B_1$ when fastening the bolts 541 and 542.

FIG. 6(A) is a schematic side view of the component holder 50 according to the exemplary embodiment of the present invention before the holding tool 53 is fixed to the horn 51 with the bolts 541 and 542. FIG. 6(B) is a schematic side view of the component holder 50 according to the exemplary embodiment of the present invention after the holding tool 53 is fixed to the horn 51 with the bolts 541 and 542.

More specifically, the bolts 541 and 542 pass through through-holes 534 and 535 in the holding tool 53, respectively, with a slight clearance and are screwed into internal threads 512 and 513, respectively, in the surface $A_2$ of the horn 51.

A fastening unit of the present invention includes fastening elements and the bolts 541 and 542 are an example of the fastening elements. The bolts 541 and 542 and the corresponding internal threads 512 and 513 are an example of the fastening unit of the present invention.

The right bolt 541 is screwed first and then the left bolt 542 is screwed. This is because the bolts 541 and 542 are right-handed screws that are tightened by rotation in the direction indicated by arrows $R_1$ and $R_2$ (see FIG. 6(B)) and, contrarily, if the bolt 541 were screwed after the bolt 542 is screwed, the holding tool 53 would be likely to rotate by moment applied during screwing the bolt 542 and consequently a gap can be formed between the surfaces $A_2$ and $B_2$. By fastening the right bolt 541 first and then left bolt 542, formation of a gap between the surfaces $A_2$ and $B_2$ can be prevented.

Of course, the bolts 541 and 542 are preferably firmly fastened with a torque near the maximum allowable torque of the screws because a sufficient fastening force can be ensured.

Since the bolts 541 and 542 are screwed into the internal threads 512 and 513, respectively, provided in the surface $A_2$ of the horn 51, the horn 51 cannot be deformed by firm fastening of the bolts 541 and 542.

In the configuration of the conventional electronic component mounting apparatus described earlier, the horn 91 can be deformed because the fixation screw 94 that tightens the two split portions 911 and 912 is used.

Instead of the split clamp structure, a configuration may be contemplated in which the holding tool is forcibly pressed into a rather small through-hole formed in the horn to fix the holding tool to the horn. However, the horn is likely to be deformed with the configuration as well. Another configuration may be contemplated in which the horn and the holding tool are formed as an integral component. However, with the configuration, the entire component including the horn is replaced every time the holding tool is replaced, leading to an increase of cost.

The bolts 541 and 542 are disposed rotational-symmetrically with respect to the horn axis line J passing through the center of a cross section of the horn 51 that is parallel to the YZ plane and extending in the direction in which ultrasonic vibration is transmitted.

The symmetrical arrangement of the bolts 541 and 542 ensures even fixation and therefore the vibration mode hardly degrades under pressure and high-quality ultrasonic bonding can be achieved.

Since the configuration uses the bolts 541 and 542 to apply sufficient surface pressure to the interface between the surface $A_2$ of the horn 51 and the surface $B_2$ of the holding tool 53, a sufficient contact force between the surfaces $A_2$ and $B_2$ for transmitting ultrasonic vibration is ensured and attenuation of ultrasonic vibration is minimized.

In the configuration of the conventional electronic component mounting apparatus described earlier, on the other hand, the holding tool 93 is only clamped by the two split portions 911 and 912 and therefore ultrasonic vibration is sometimes insufficiently transmitted to the holding tool 93.

Since the structure using the bolts 541 and 542 is very simple, the holding tool 53 can be readily replaced in accordance with the type of the electronic component 8.

It is desirable that the surface roughness of the surface $A_1$ of the horn 51 and the surface $B_1$ of the holding tool 53 be low. This is because the contact area between the surface $A_1$ of the horn 51 and the surface $B_1$ of the holding tool 53 is increased so that pressure is applied uniformly.

It is also desirable that the surface roughness of the surface $A_2$ of the horn 51 and the surface $B_2$ of the holding tool 53 be low in order to increase the strength of contact between the surface $A_2$ of the horn 51 and the surface $B_2$ of the holding tool 53 to allow good transmission of vibration.

More specifically, the arithmetic mean roughness Ra of the surfaces $A_1$, $A_2$, $B_1$, and $B_2$ is preferably less than or equal to 3.2.

The surfaces $A_1$, $A_2$, $B_1$, and $B_2$ are preferably flat.

The use of the low surface-roughness flat surfaces $A_1$, $A_2$, $B_1$, and $B_2$ causes a follower force to act between the horn 51 and the holding tool 53 to enable stable ultrasonic bonding.

The low surface roughness and flatness can be readily achieved by allowing the surfaces $A_1$, $A_2$, $B_1$, and $B_2$ to be readily polished.

The horn axis line J is preferably non-parallel to the surface $A_1$ and non-perpendicular to the surface $A_2$. The reasons will be described in detail with reference to FIGS. 5, 7(A), and 7(B).

Figure 7:
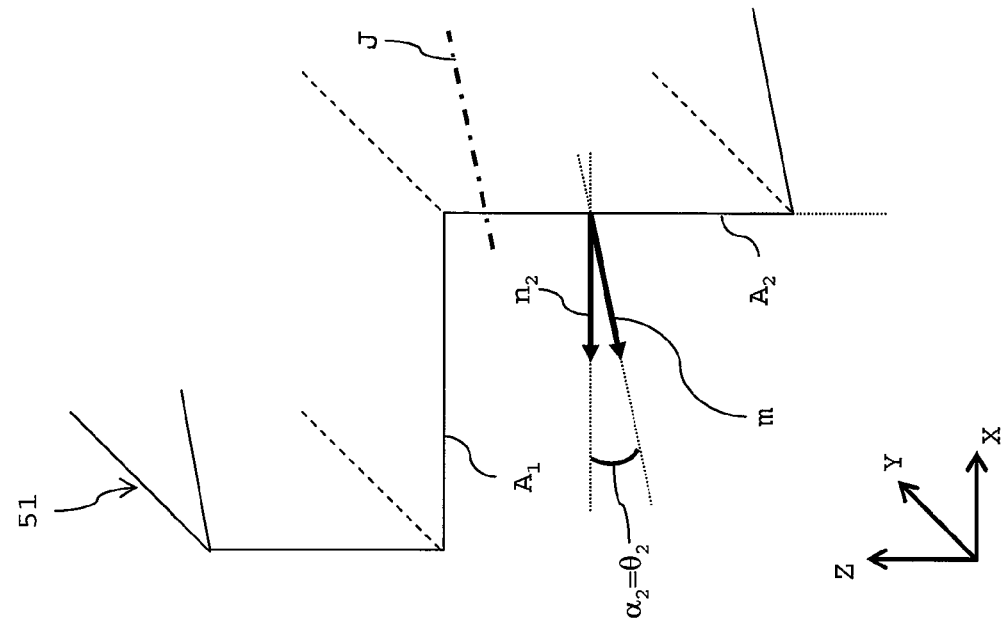
FIG. 7(A) is a schematic exploded perspective view illustrating the relationship between a horn axis line and a surface $A_1$ in the exemplary embodiment of the present invention.
FIG. 7(B) is a schematic exploded perspective view illustrating the relationship between the horn axis line and a surface $A_2$ in the exemplary embodiment of the present invention.
Figure 7:
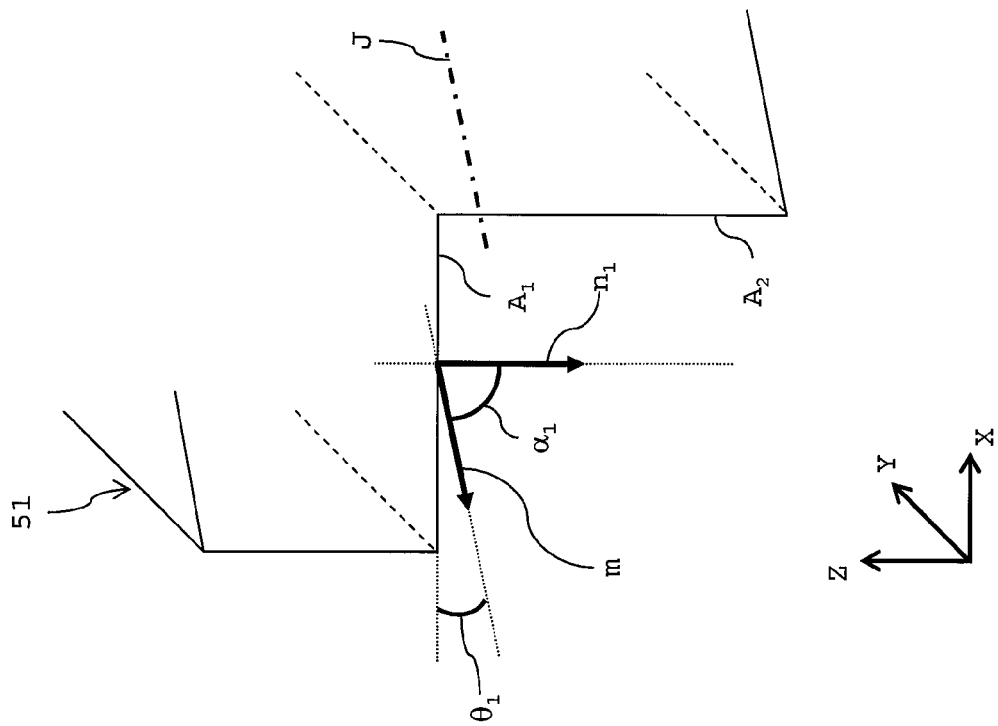

FIG. 7(A) is a schematic exploded perspective view illustrating the relationship between the horn axis line J and the surface $A_1$ in the exemplary embodiment of the present invention. FIG. 7(B) is a schematic exploded perspective view illustrating the relationship between the horn axis line J and the surface $A_2$ in the exemplary embodiment of the present invention.

Before beginning the description, it will be helpful to provide the following information:

(1) The expression of "the horn axis J is non-parallel to the surface $A_1$" means that an angle $\theta_1$ defined as the complementary angle of the angle $\alpha_1$ between the direction vector m of the horn axis line J and the normal vector $n_1$ of the surface $A_1$ is not 0 degrees (angle $\alpha_1$ can be safely considered to be greater than or equal to 0 degrees and less than or equal to 90 degrees).

(2) The expression of "the horn axis line J is non-perpendicular to the surface $A_2$" means that an angle $\theta_2$ defined as the angle $\alpha_2$ between the direction vector m of the horn axis line J and the normal vector $n_2$ of the surface $A_2$ is not 0 degrees (angle $\alpha_2$ can be safely considered to be greater than or equal to 0 degrees and less than or equal to 90 degrees).

(3) In the exemplary embodiment of the present invention, the surface $A_1$ is orthogonal to the surface $A_2$ and the horn axis line J is orthogonal to the cross line of the surfaces $A_1$ and $A_2$, therefore the angle $\theta_1$ is equal to the angle $\theta_2$.

The holding tool 53 can be readily manufactured accurately, since the right angle is a standard one, by using the above-described structure in which the surface $A_1$, which is a level surface, is orthogonal to the surface $A_2$. The holding tool 53 may not be so readily manufactured accurately by using a structure in which the angle between the surfaces $A_1$ and $A_2$ is an acute angle.

More specifically, as mentioned before, the holding tool 53 is preferably designed to have the shape of a rectangular parallelepiped. This design is desirable because the direction of the bolt axis line K of the bolt 541 for fixing the holding tool 53 to the horn 51 is parallel to the surface $A_1$ and perpendicular to the surface $A_2$, and thus such two conditions are compatible with each other.

The above two conditions are not compatible with each other in a structure in which the angle between the surfaces $A_1$ and $A_2$ is an obtuse angle as shown in FIGS. 8(A) and 8(B), for example.

FIG. 8(A) is a schematic cross-sectional view illustrating a structure in which the surface $A_1$ is not orthogonal to the surface $A_2$ according to an exemplary embodiment of the present invention (I). FIG. 8(B) is a schematic cross-sectional view illustrating a structure in which the surface $A_1$ is not orthogonal to the surface $A_2$ according to another exemplary embodiment of the present invention (II).

As shown in FIG. 8(A), if the direction of the bolt axis line K is perpendicular to the surface $A_2$ but non-parallel to the surface $A_1$, the cap of the bolt 541 is likely to protrude on the (−Z) side when the cap is relatively large. This can cause, during the flip-chip mounting, damages to the electronic components mounted on the circuit board 9 due to a possible collision of the cap of the bolt 541 with the electronic components.

As shown in FIG. 8(B), if the direction of the bolt axis line K is parallel to the surface $A_1$ but non-perpendicular to the surface $A_2$, a gap is likely to be formed between the cap of the bolt 541 and the holding tool 53, which may also happen when the angle between the surfaces $A_1$ and $A_2$ is an acute angle. This can cause looseness of fastening by bolt 541.

First, the reason why it is desirable that the horn axis line J be non-parallel to the surface $A_1$.

If the horn axis line J were parallel to the surface $A_1$, ultrasonic vibration would include no components in the direction perpendicular to the surface $A_1$.

Here, the direction perpendicular to the surface $A_1$ is identical to the direction in which pressure applied by the pressing unit 33 is transmitted to the electronic component 8 held at the tip 531 by suction.

Therefore, if the horn axis line J were parallel to the surface $A_1$, no longitudinal ultrasonic vibration would be applied when traverse ultrasonic vibration is applied to the electronic component 8 through the tip 531. However, in real-world ultrasonic bonding, it is desirable that there be longitudinal vibration to some extent, since bonding failures hardly occur. Therefore, it is desirable that the horn axis line J be non-parallel to the surface $A_1$.

Of course, an excessively large angle $\theta_1$ is undesirable because if the angle $\theta_1$ is too large, components parallel to the surface $A_1$ for causing local slippage at the bonding interface between the circuit board 9 and the electronic component 8 which is essentially necessary in ultrasonic bonding will be too small.

Therefore, the angle $\theta_1$ is preferably less than or equal to 45 degrees, that is, the angle between the horn axis line J and the surface $A_1$ is preferably less than or equal to 45 degrees, in order for ultrasonic vibration to include a certain amount of components parallel to the surface $A_1$.

The reason why it is desirable that the horn axis line J be non-perpendicular to the surface $A_2$ will be described next.

If the horn axis line J were perpendicular to the surface $A_2$, ultrasonic vibration would include only components in the direction perpendicular to the surface $A_2$.

Here, the direction perpendicular to the surface $A_2$ is identical to the direction of the bolt axis line K of the bolt 541 for fixing the holding tool 53 to the horn 51.

Therefore, it is undesirable that the horn axis line J be perpendicular to the surface $A_2$, because load in the direction of the bolt axis line K, which can cause looseness of fastening by bolt 541, is likely to increase.

If the bolt 541 loosens, between the horn 51 and the holding tool 53, a difference of the phase of ultrasonic vibration may occur, and a follower force may not act depending on the level of the load with which the electronic component 8 is pressed against the circuit board 9.

Further, if the bolt 541 loosens, since a vibrator of the ultrasonic transducer 52 may not operate normally because the resonant state of the ultrasonic vibration can not be maintained, there are concerns about adverse effects caused by bonding failures and chip cracks.

Therefore, the horn axis line J is preferably non-perpendicular to the surface $A_2$.

Of course, an excessively large angle $\theta_2$ is undesirable because components parallel to the surface $A_2$, which apply load to the sidewall of the internal thread 512 into which the bolt 541 is screwed, will excessively increase.

Therefore, the angle $\theta_2$ is preferably less than or equal to 45 degrees, that is, the complementary angle of the angle between the horn axis line J and the surface $A_2$ is preferably less than or equal to 45 degrees, in order to prevent ultrasonic vibration from including an excessively large amount of components parallel to the surface $A_2$.

In the end, since the angle $\theta_1$ in the exemplary embodiment is identical to the angle $\theta_2$ as noted above, when the angle $\theta$ is chosen to be a nonzero angle, (1) the horn axis line J is non-parallel to the surface $A_1$ and bonding failures hardly occur, and (2) the horn axis line J is non-perpendicular to the surface $A_2$ and the bolt 541 does not loosen. Consequently, the angle $\theta_2$, that is, the angle $\theta$ between the bolt axis line K and the horn axis line J (see FIG. 5), is chosen to be greater than 0 degrees but less than or equal to 45 degrees so that pressure can be uniformly applied to the electronic component 8 while ultrasonic vibration is being stably applied to the electronic component 8.

If a heater 361 is provided in order to improve the reliability of ultrasonic bonding by heating an electronic component 8, the heating can be used to increase the fastening retaining force by the bolts 541 and 542. This will be described in detail below with reference to FIG. 9.

Figure 9:
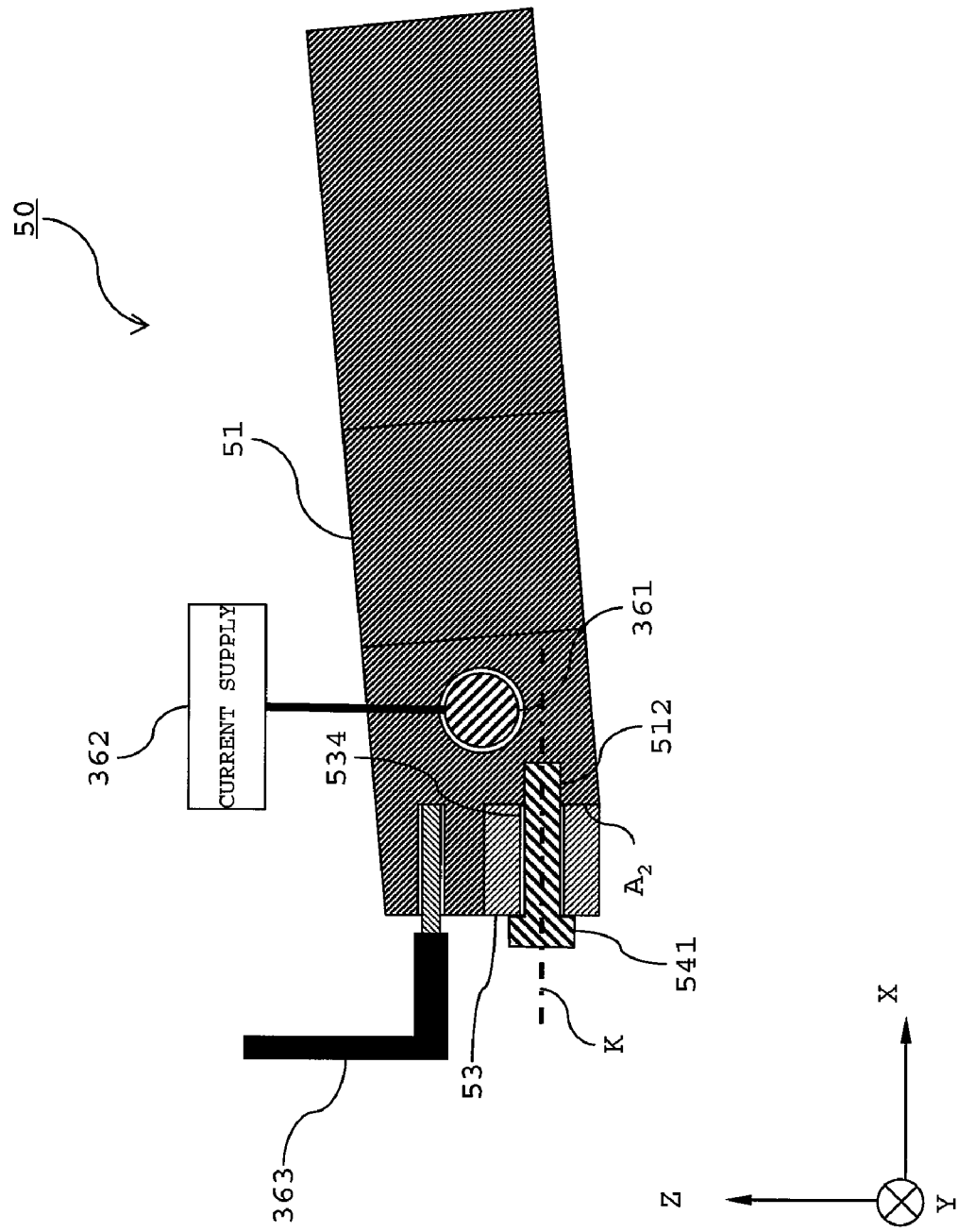
FIG. 9 is a schematic cross-sectional view of an electronic component mounting apparatus including a heater inserted in a horn according to an exemplary embodiment of the present invention.

FIG. 9 is a schematic cross-sectional view of an electronic component mounting apparatus 1 in which a heater 361 is inserted in a horn 51 according to an exemplary embodiment of the present invention.

The heater 361 for applying heat to a holding tool 53 is inserted in the horn 51.

The heater 361 is connected to a current supply 362 and heats the holding tool 53, thereby heating an electronic component 8.

A thermocouple 363 is inserted in the tip of the horn 51 for measuring the temperature in the vicinity of the holding tool 53 to accurately monitor the temperature.

Both of the heater 361 and the thermocouple 363 are inserted in the horn 51 with a small clearance of approximately 0.1 mm so that the heater 361 and the thermocouple 363 do not affect ultrasonic vibration, but heating and temperature measurement are not interfered with thanks to thermal radiation and convection.

If the relation between the thermal expansion coefficient at of a material of the holding tool 53 and the thermal expansion coefficient $\sigma_b$ of a material of the bolts 541 and 542 is $\sigma_b \leq \sigma_t$, a large fastening retaining force by the bolts 541 and 542 can be achieved.

In fact, if the relation $\sigma_b \leq \sigma_t$ holds, the expansion of the main bodies of the bolts 541 and 542 in the length direction is smaller than the expansion of the holing tool 53 in the direction. Therefore, the drag between the cap of each of the cap bolts 541 and 542 and the holding tool 53 increases.

If there is the reverse relation $\sigma_b > \sigma_t$, the expansion of the main bodies of the bolts 541 and 542 in the length direction is greater than the expansion of the holding tool 53 in the direction. Therefore, a gap is likely to be formed between the cap of each bolt 541 and 542 and the holding tool 53 and the fastening retaining force by the bolts 541 and 542 can be reduced by heating.

The relation $\sigma_b \leq \sigma_t$ can be satisfied by choosing an appropriate combination of two materials such as two types of stainless steels.

More specifically, for example, the holding tool 53 may be made of unhardened SUS4 and the bolts 541 and 542 may be made of a hardened SUS material.

Consequently, the fastening retaining force is increased by heating. Therefore, if there are concerns about adverse effects of heating caused by variations in a vibration property relating to the resonance frequency of ultrasonic vibration, for example, such adverse effects can be compensated for.

Given that the fastening retaining force is increased during heating as described above, a smaller control torque can be used as the fastening retaining force under non-heating conditions, which can facilitate replacement of the holding tool 53.

Primarily referring to FIGS. 1 and 10, operation of the electronic component mounting apparatus according to the exemplary embodiment will be described. In conjunction with the description of operation of the electronic component mounting apparatus according to the exemplary embodiment, one embodiment of an electronic component mounting method of the present invention will also be described.

Figure 10:
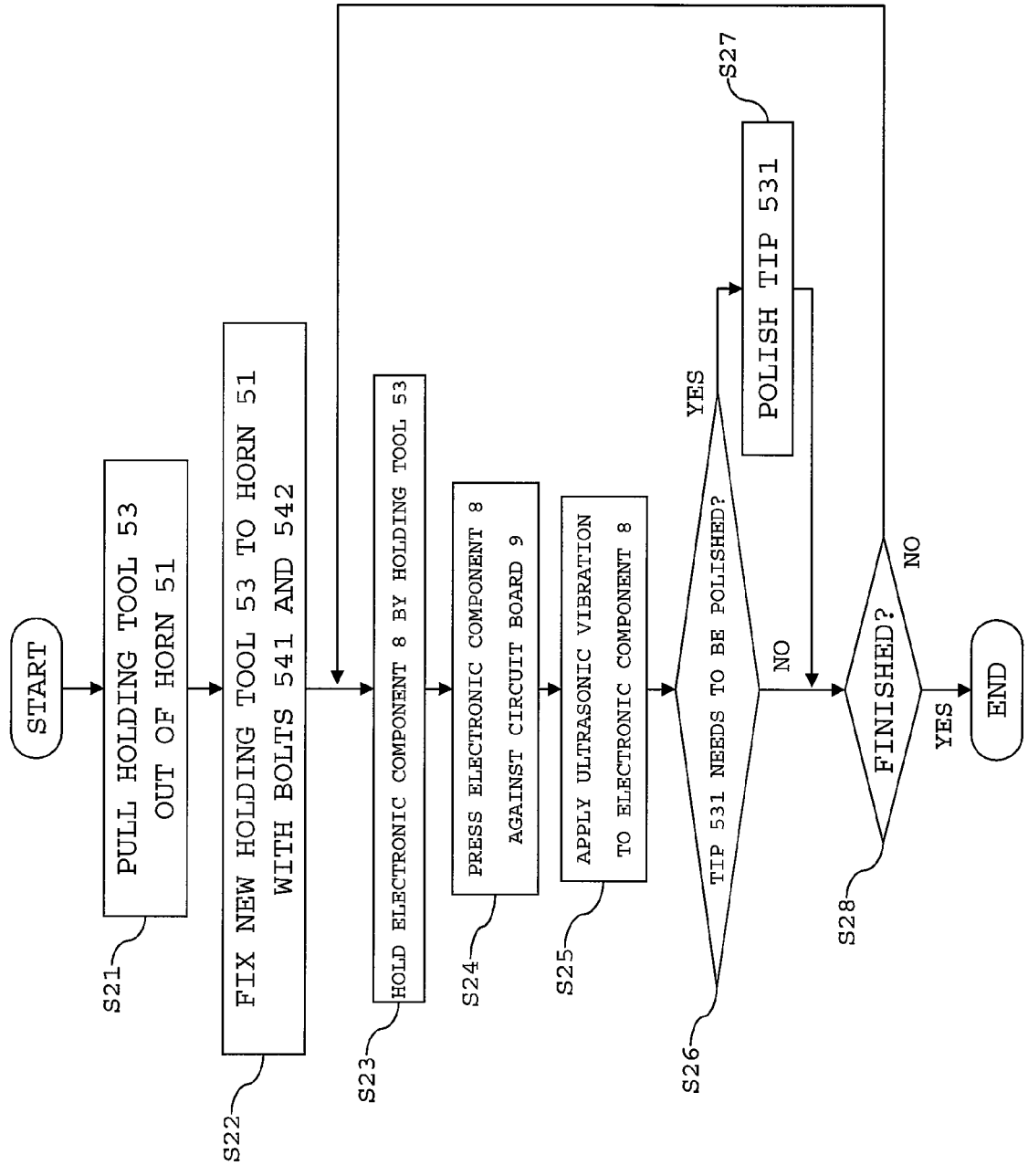
FIG. 10 is a flowchart illustrating operation of an electronic component mounting apparatus according to the exemplary embodiment of the present invention.

FIG. 10 is a flowchart illustrating operation of the electronic component mounting apparatus 1 according to the exemplary embodiment of the present invention.

To replace the holding tool 53, that is, to remove the attached holding tool 53 and then fix a new holding tool 53 to the horn 51, the holding tool 53 is pulled out of the horn 51 (step S21).

The replacement of the holding tool 53 is performed, for example, when the holding tool 53 has become worn to a length shorter than or equal to a predetermined value or when an electronic component 8 of a different type is to be mounted.

Then, a new holding tool 53 is fixed to the horn 51 with bolts 541 and 542 (step S22).

After the holding tool 53 is replaced, it is required to examine whether the condition of contact between the holding tool 53 and the horn 51 has been reproduced. The examination may be conducted directly by measuring vibration of the tip 531 or indirectly by obtaining an electrical property of the ultrasonic transducer 52.

After completion of the replacement of the holding tool 53, mounting of an electronic component 8 onto the circuit board 9 is performed as follows.

The tray driving mechanism 413 in the component feeder 4 moves the component tray 411 on which many electronic components 8 are placed with their bonding surfaces oriented in the (+Z) direction to under the feed head 42 positioned on the (−X) side. The feed collet 421 sucks the bonding surface of an electronic component 8.

The feed head driving mechanism 43 moves the feed head 42 in the (+X) direction while turning the feed head 42. The mounting head 5 of the component mounting section 31 faces the feed collet 421 at a position where the component mounting section 31 is to receive the electronic component 8.

Then, the pressing unit 33 slightly lowers the shaft 35 until the holding tool 53 sucks the upper surface of the electronic component 8 at the tip 531. Then, the feed collet 421 stops sucking and the holding tool 53 receives the electronic component 8 from the feed collet 421.

Thus, the electronic component 8 is held by the holding tool 53 (step S23).

After the electronic component 8 is received, the pressing unit 33 slightly raises the shaft 35 and the feed head 42 is retracted to its original position.

As the feed head 42 is retracted, the component mounting section 31 moves to directly above the image pickup unit 60. The image pickup unit 60 takes an image of the electronic component 8 held at the tip 531.

The image data output from the image pickup unit 60 is sent to the controller 10. Based on the sent image data, the controller 10 controls the component mounting section 31 to cause the component holder 50 to turn around the axis extending in the Z-direction to correct the attitude of the electronic component 8.

If the controller 10 determines that the attitude of the electronic component 8 cannot be corrected for some reason such as an suction error, the operation for mounting the electronic component 8 is stopped and the component mounting section 31 is moved to above a component withdrawing mechanism (not shown), where the electronic component 8 is withdrawn.

The mounting section driving mechanism 32 moves the component mounting section 31 to above the position on the circuit board 9 held by the circuit-board holder 2 in which the electronic component 8 is to be mounted.

The component holder 50 is lowered toward the circuit board 9 until a bump formed on the bonding surface of the electronic component 8 contacts an electrode on the circuit board 9.

Then the pressing unit 33 lowers the shaft 35 to press the electronic component 8 against the circuit board 9 (step S24).

The ultrasonic transducer 52 applies ultrasonic vibration to the electronic component 8 through the component holder 50 while the electronic component 8 is being pressed (step S25).

As a result, the bump formed on the bonding surface of the electronic component 8 is electrically bonded to the electrode on the circuit board 9. In this way, bonding and mounting of the electronic component 8 are conducted at a time.

After completion of the mounting of the electronic component 8, the holding tool 53 stops sucking the electronic component 8 and the pressing unit 33 raises the holding tool 53 off the electronic component 8.

Then, checking is made to see whether the surface of the tip 531 that contacts the electronic component 8 needs to be polished (step S26).

Polishing is needed for removing, for example, component substances of the substrate of the electronic component 8 attached to the tip 531.

If it is determined that polishing is needed, the component mounting section 31 is moved to over the polishing unit 7, the tip 531 is pressed against the polishing sheet 71, and vibration for polishing is applied by the ultrasonic transducer 52 (step S27).

After completion of the polishing of the tip 531 or if it is determined that polishing is not needed (step S26), determination is made as to whether mounting of an additional electronic component 8 is to be performed.

When an additional electronic component 8 is to be mounted, the component mounting section 31 is moved again to the position for receiving the electronic component 8 from the feed collet 421, then the mounting operation for mounting the electronic component 8 to the circuit board 9 described above is repeated (steps S23 to S25).

During the repetitive mounting operation, the heater 361 constantly heats the holding tool 53 to keep the holding tool 53 at an appropriate processing temperature.

After all electronic components 8 required are mounted on the circuit board 9, the mounting operation will end (step S28).

Various variations of the exemplary embodiment detailed above can be contemplated.

Some variations will be described in detail with reference to FIGS. 11 to 13.

Figure 11:
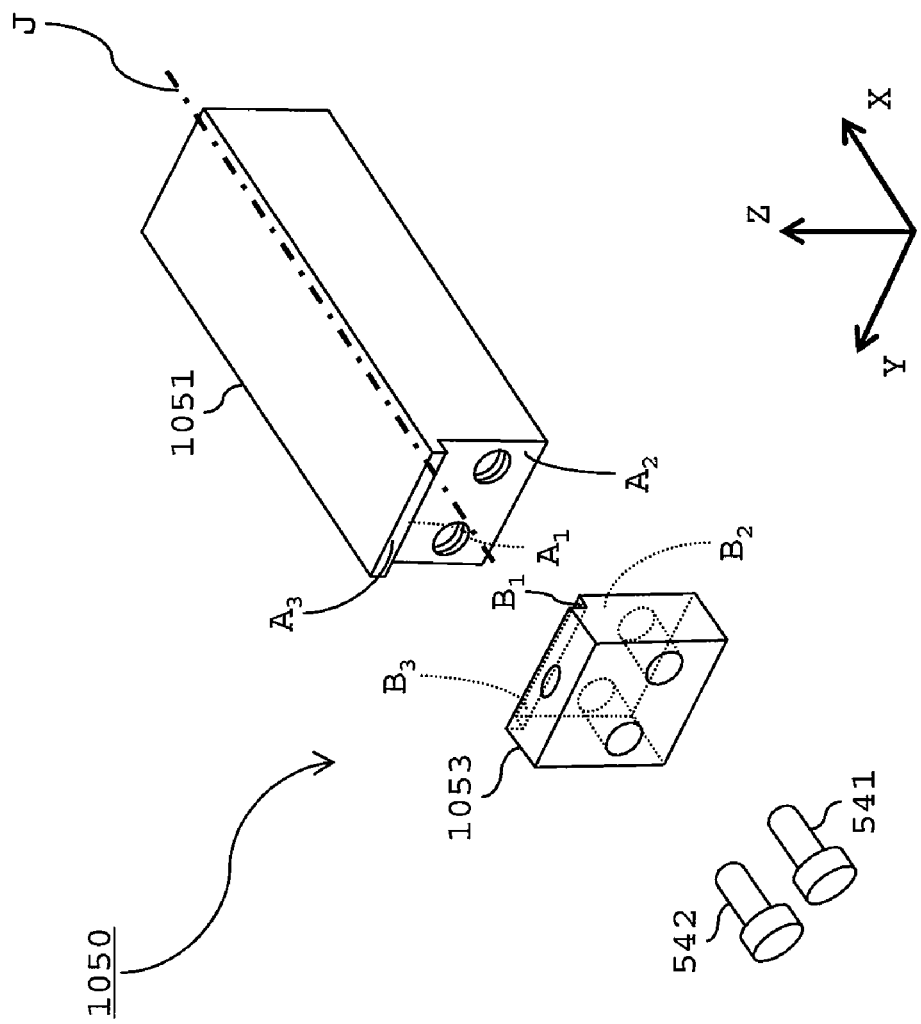
FIG. 11 is a schematic exploded perspective view of a component holder of an electronic component mounting apparatus according to an exemplary embodiment of the present invention (I)

FIG. 11 is a schematic exploded perspective view of a component holder 1050 of an electronic component mounting apparatus according to an exemplary embodiment of the present invention.

Figure 12:
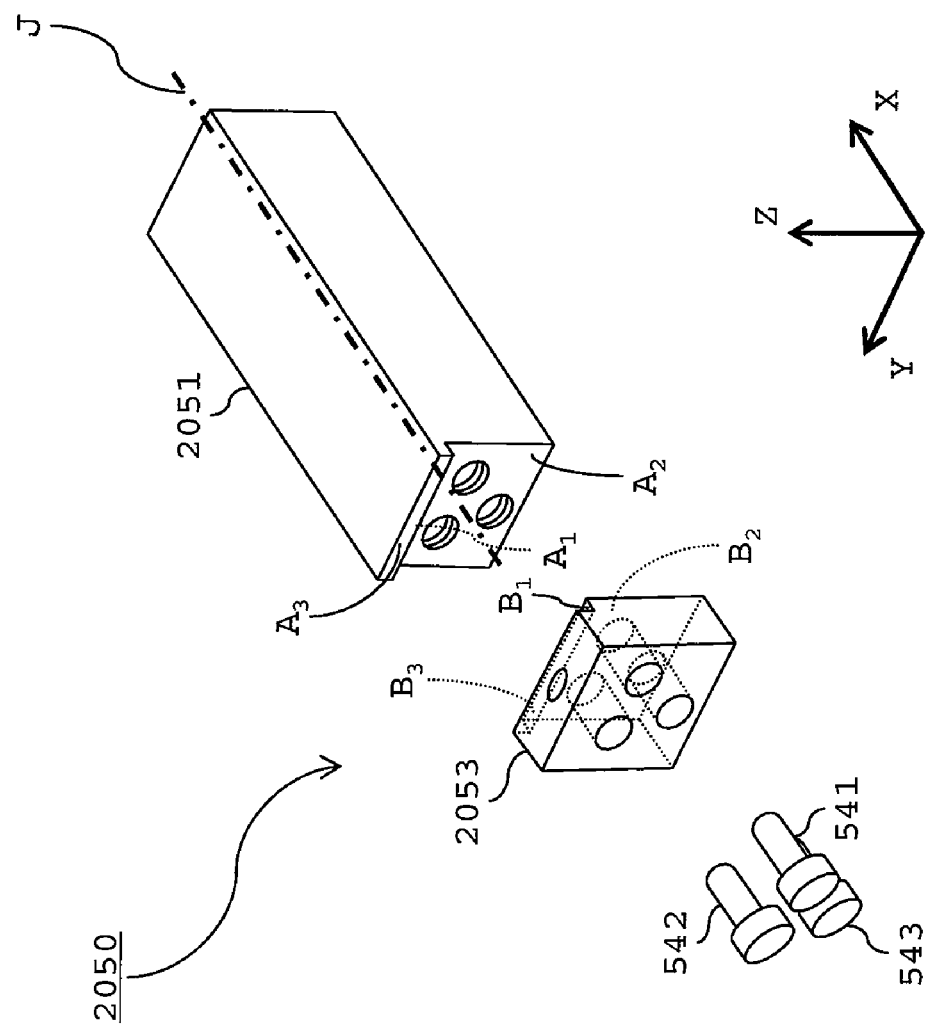
FIG. 12 is a schematic exploded perspective view of a component holder of an electronic component mounting apparatus according to an exemplary embodiment of the present invention (II)

FIG. 12 is a schematic perspective view of a component holder 2050 of an electronic component mounting apparatus according to another exemplary embodiment of the present invention.

Figure 13:
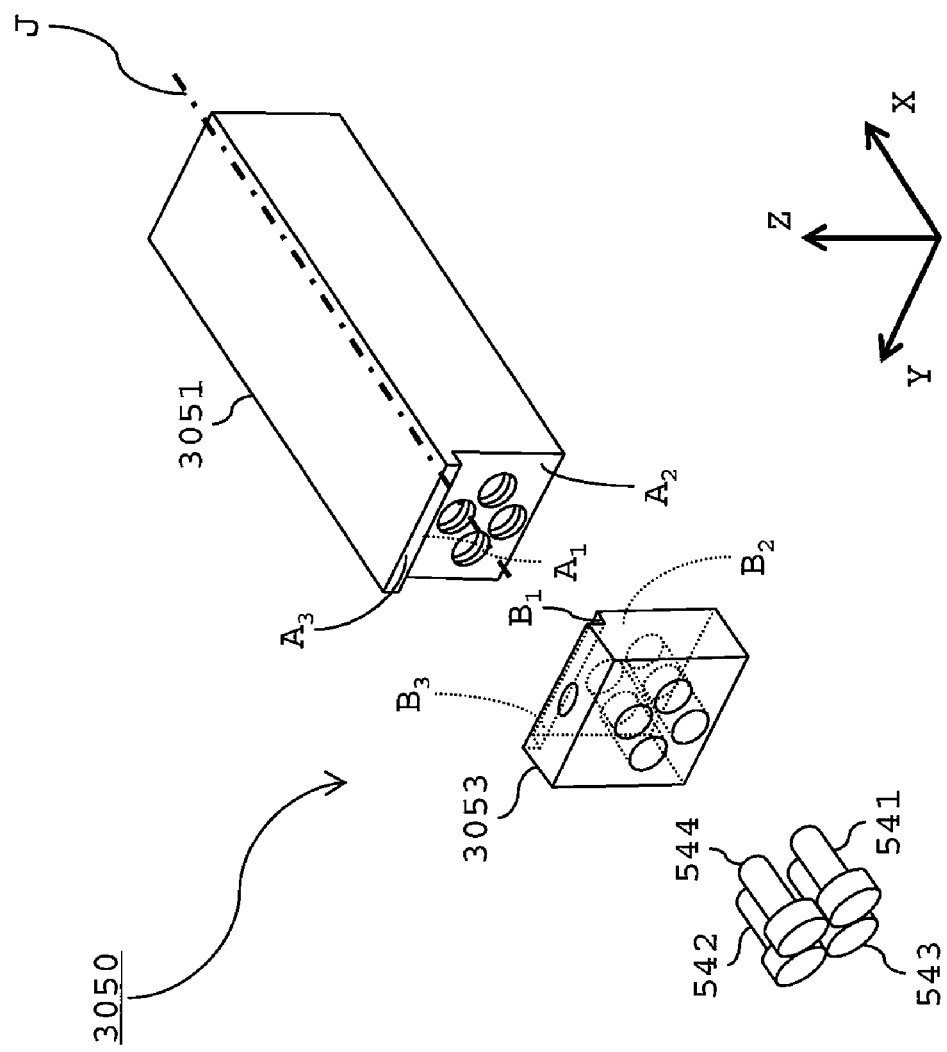
FIG. 13 is a schematic exploded perspective view of a component holder of an electronic component mounting apparatus according to an exemplary embodiment of the present invention (III)
Figure 14:
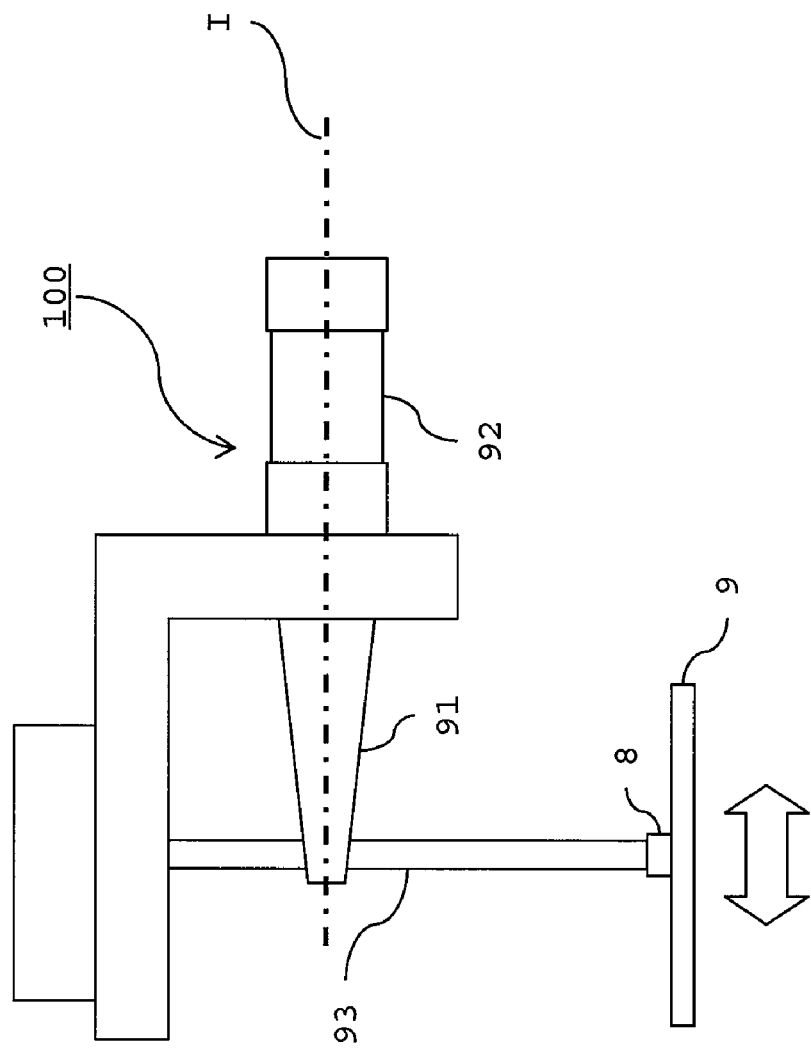
FIG. 14 is a schematic side view of a conventional electronic component mounting apparatus.
Figure 15:
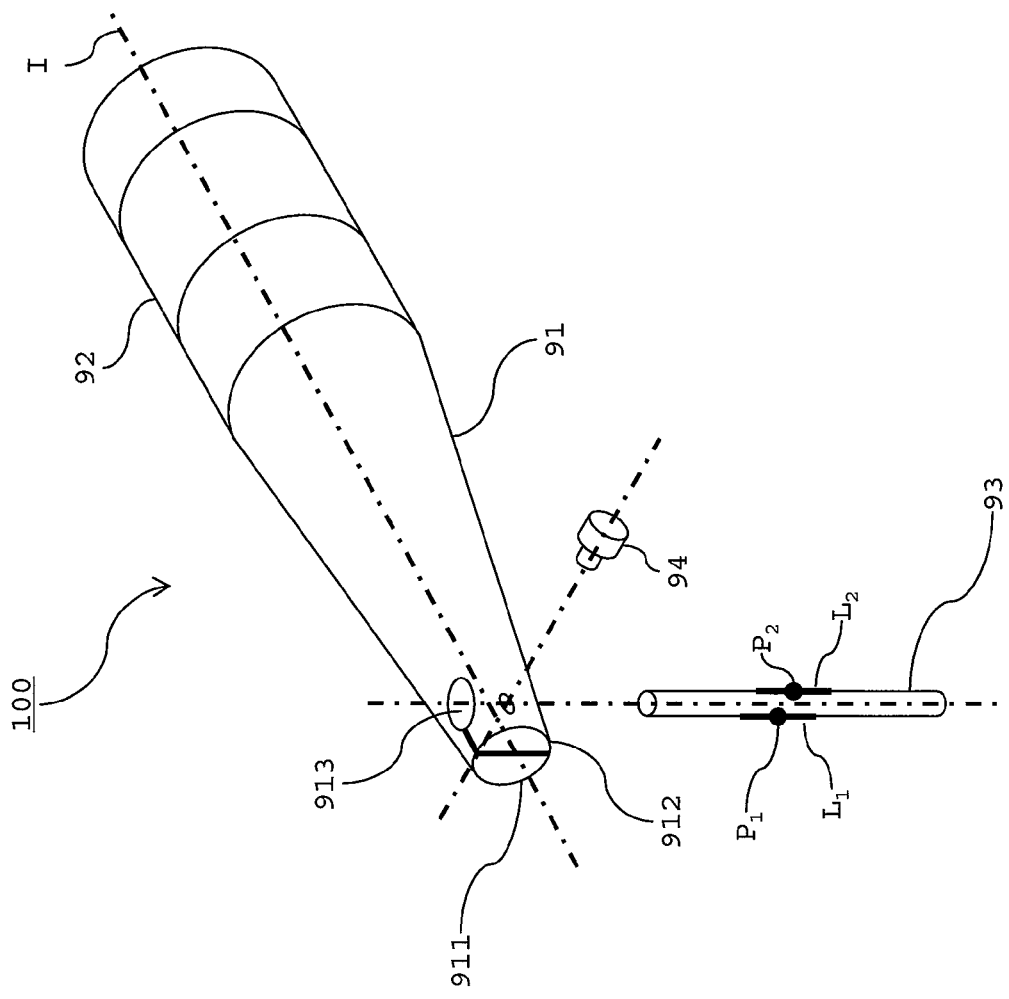
FIG. 15 is a schematic perspective view of a mounting head of the conventional electronic component mounting apparatus.

FIG. 13 is a component holder 3050 of an electronic component mounting apparatus according to yet another exemplary embodiment of the present invention.

The component holders 1050, 2050, and 3050 include a horn 1051, 2051, 3051 and a holding tool 1053, 2053, 3053, respectively.

Each of the horns 1051, 2051, and 3051 has a configuration similar to that of the horn 51, except that the area of the surface $A_2$ is greater and the area of the surface $A_1$ is smaller.

Each of the holding tools 1053, 2053, and 3053 has a configuration similar to that of the holding tool 53, except that each of the holding tools 1053, 2053, and 3053 has the shape of a rectangular parallelepiped with a ridge on its top surface. Each of the holding tools 1053, 2053, and 3053 further has a surface $B_3$ on the ridge that can be brought into intimate contact with an upper end surface $A_3$, which is parallel to the YZ plane of each of the horns 1051, 2051, and 3051, and parallel to the YZ plane.

Like the surfaces $A_2$ and $B_2$, the surfaces $A_3$ and $B_3$ function as surfaces for transmitting ultrasonic vibrations applied by an ultrasonic transducer 52.

The holding tool 1053 is fixed to the horn 1051 with bolts 541 and 542; the holding tool 2053 is fixed to the horn 2051 with bolts 541, 542 and 543; and the holding tool 3053 is fixed to the horn 3051 with bolts 541, 542, 543, and 544.

The bolts 541, 542, 543, and 544 in any of the component holders 1050, 2050, and 3050 are disposed rotational-symmetrically with respect to the horn axis lines J of the horns 1051, 2051, and 3051, respectively.

The symmetrical arrangement of the bolts 541, 542, 543, and 544 ensures even fixation and therefore the vibration mode hardly degrades under pressure and high-quality ultrasonic bonding can be achieved.

With the configuration of any of the component holders 1050, 2050, and 3050, the holding tools 1053, 2053, and 3053 can be more firmly fixed to the horns 1051, 2051, and 3051 with better reproducibility and attenuation of the amplitude and variations in the phase of ultrasonic vibration can be further reduced.

Any of such configurations may be selected appropriately according to the type of an electronic component 8 and the like.

The electronic component mounting apparatus and the electronic component mounting method according to the present invention are capable of achieving more stable ultrasonic bonding and are useful as an electronic component mounting apparatus and an electronic component mounting method that mount electronic components on a circuit board or the like.

What is claimed is:

1. An electronic component mounting apparatus comprising:
   a component holder which holds an electronic component;
   a pressing unit which applies pressure to the held electronic component through the component holder; and
   an ultrasonic transducer which applies ultrasonic vibration to the held electronic component through the component holder,
   wherein the component holder includes a horn to one end of which the ultrasonic transducer is fixed, and a holding tool which is fixed to the other end of the horn by a fastening unit and holds the electronic component,
   the horn has a first horn surface and a second horn surface at the other end,
   the holding tool has a first tool surface in intimate contact with the first horn surface and a second tool surface in intimate contact with the second horn surface,
   the fastening unit is a bolt and an internal thread,
   the internal thread is provided in the second horn surface, and
   the bolt passes through a through-hole provided in the holding tool and is screwed into the internal thread, and a screwing applies surface pressure to a connection part between the second horn surface and the second tool surface in a direction in which the applied ultrasonic vibration is transmitted.

2. The electronic component mounting apparatus according to claim 1,
   wherein the first horn surface and the first tool surface are surfaces transmitting at least the applied pressure, and
   the second horn surface and the second tool surface are surfaces transmitting at least the applied ultrasonic vibration.

3. The electronic component mounting apparatus according to claim 1,
   wherein the fastening unit includes a plurality of fastening elements, and
   the plurality of fastening elements are disposed symmetrically with respect to a horn axis line passing through a center of a cross section of the horn and extending in a direction in which the applied ultrasonic vibration is transmitted.

4. The electronic component mounting apparatus according to claim 2, wherein a horn axis line passing through a center of a cross section of the horn and extending in a direction in which the applied ultrasonic vibration is transmitted is non-parallel to the first horn surface.

5. The electronic component mounting apparatus according to claim 4, wherein an angle the horn axis line forms with respect to the first horn surface is less than or equal to 45 degrees.

6. The electronic component mounting apparatus according to claim 2, wherein a horn axis line passing through a center of a cross section of the horn and extending in a direction in which the applied ultrasound vibration is transmitted is non-perpendicular to the second horn surface.

7. The electronic component mounting apparatus according to claim 6, wherein a complementary angle of an angle the horn axis line forms with respect to the second horn surface is less than or equal to 45 degrees.

8. The electronic component mounting apparatus according to claim 1,
wherein the horn includes a heater which applies heat to the holding tool, and
a fastening retaining force of the fastening unit increases when the heat is applied.

9. The electronic component mounting apparatus according to claim 1, wherein the pressing unit applies pressure to the held electronic component through a supporter fixed to the horn.

* * * * *